United States Patent [19]

Mori et al.

[11] Patent Number: 4,884,124
[45] Date of Patent: Nov. 28, 1989

[54] RESIN-ENCAPSULATED SEMICONDUCTOR DEVICE

[75] Inventors: Ryuichiro Mori; Tatsuhiko Akiyama; Katsuyuki Fukudome, all of Itami, Japan

[73] Assignee: Mitsubishi Denki Kabushiki Kaisha, Japan

[21] Appl. No.: 85,769

[22] Filed: Aug. 17, 1987

[30] Foreign Application Priority Data

Aug. 19, 1986 [JP] Japan .................................. 61-194263
Aug. 19, 1986 [JP] Japan .................................. 61-194264
Aug. 28, 1986 [JP] Japan .................................. 61-204216

[51] Int. Cl.$^4$ ............................................ H01L 23/28
[52] U.S. Cl. ............................................ 357/72; 357/70
[58] Field of Search .................................... 357/72, 70

[56] References Cited

U.S. PATENT DOCUMENTS 4,268,848  5/1981  Caset et al. ........................... 357/80
4,604,642  8/1986  Sakurai .................................. 357/72

FOREIGN PATENT DOCUMENTS 55-53450  4/1980  Japan .................................. 357/72
45959  9/1980  Japan .................................. 357/72
45960  9/1980  Japan .................................. 357/72
59-16357  1/1984  Japan .................................. 357/72
60-86851  5/1985  Japan .................................. 357/72
60-130851  7/1985  Japan .................................. 357/72
76747  9/1985  Japan .................................. 357/72
61-68943  7/1986  Japan .................................. 357/72
0050050  3/1988  Japan .................................. 357/72

*Primary Examiner*—Rolf Hille
*Assistant Examiner*—Hoanganh Le
*Attorney, Agent, or Firm*—Leydig, Voit & Mayer

[57] ABSTRACT

A semiconductor device comprises a semiconductor element which is bonded to a flat base and encapsulated in a resin. The base has a bonding section at its center to which the semiconductor element is bonded, the area of the bonding section being smaller than that of the bottom surface of the semiconductor element. The portion of the base outside the bonding section has a plurality of through holes or depressions formed in its top and bottom surfaces which increase the adhesion between the resin and the base. The bonding section may be substantially separated from the remainder of the base by elongated through holes or depressions which substantially surround the bonding section.

8 Claims, 3 Drawing Sheets

RESIN-ENCAPSULATED SEMICONDUCTOR DEVICE

BACKGROUND OF THE INVENTION

This invention relates to a resin-encapsulated semiconductor device, and more particularly to one which has improved resistance to bending caused by temperature variations.

A conventional semiconductor device of the type to which the present invention pertains is illustrated in cross section in FIG. 1. A semiconductor element 1 is bonded at the center of its bottom surface to the top surface of a flat base 5 by a bonding material 6. The semiconductor element 1 and the base 5 are hermetically encapsulated in a molded resin 2. The terminal pads of the semiconductor element 1 are electrically connected to a plurality of external leads 3 which extend to the outside of the resin 2 by internal leads 4 in the form of fine gold wires. The base 5 and the external leads 3 are commonly made from a copper alloy. In FIG. 1, t1 and t3 are the thicknesses of the resin 2 above and below th semiconductor element 1, respectively, and t2 is the thickness of the semiconductor element 1 itself.

FIGS. 2a and 2b are respectively a plan view and a vertical cross-sectional view of the semiconductor element 1, the base 5, and the bonding material 6. As can be seen from these figures, the area in which bonding of the semiconductor element 1 is performed is smaller than the total area of the bottom surface of the semiconductor element 1.

It is extremely difficult to obtain a reliable bond between the semiconductor element 1 and the base 5 when the semiconductor element 1 has large dimensions. If the surface area in which bonding is performed is too small, the bond will have inadequate strength, and the semiconductor element 1 may come loose from the base 5 before encapsulating can be performed. On the other hand, if the surface area of bonding is too large, as shown in FIG. 3, the semiconductor element 1 and the base 5 may be subject to bending prior to encapsulation due to temperature variations. This bending is caused by the great difference between the coefficient of thermal expansion of the silicon which constitutes the semiconductor element 1 (approximately $3.5 \times 10^{-6}/°$ C. for Si) and that of the base 5 (approximately $1.7 \times 10^{-6}/°$ C. for a copper alloy). The stresses due to this bending can easily damage the semiconductor element 1.

Even if no bending takes place prior to encapsulation, bending often takes place due to temperature variations subsequent to encapsulation, particularly when the semiconductor element 1 is large. The coefficient of thermal expansion of the resin 2 (approximately $2-5 \times 10^{-5}/°$ C. for an epoxy resin) is significantly less than that of the semiconductor element 1, and as the adhesion between the resin 2 and the base 5 is normally less than that between the resin 2 and the semiconductor element 1, if t1=t3, bending of the semiconductor element 1 and the resin 2 will occur as illustrated in FIG. 1 if there are temperature variations subsequent to encapsulation, leading to damage of either the semiconductor element 1 or the resin 2.

It is conceivable to temporarily prevent the bending of the semiconductor element 1 by controlling the thickness of the resin 2 so that t3>t1, but as shown in FIG. 4, even in this case, the resin 2 is subject to bending when there are temperature variations, and damage to the device can not be prevented.

SUMMARY OF THE INVENTION

It is therefore an object of the present invention to provide a resin-encapsulated semiconductor device which is not subject to bending damage due to thermal expansion either before or after encapsulation.

A semiconductor device in accordance with the present invention has a semiconductor element which is bonded at the center of its bottom surface to the top surface of a flat base. The semiconductor element and the base are encapsulated in a resin. The top surface of the base has a bonding section which is smaller than the area of the bottom surface of the semiconductor element, and the semiconductor element is bonded to this bonding section. The base has a plurality of holes formed in its upper and lower surfaces in the portion which surrounds the bonding section. These holes increase the adhesion between the resin and the base, whereby the bending of the device due to temperature variations subsequent to encapsulation is prevented. The holes in the base may be in the form of through holes or depressions.

The bonding section of the base may be substantially surrounded by elongated isolating holes formed in at least the top surface of the base which substantially isolate the bonding section from the rest of the base. The isolating holes define the outer bounds of the bonding section so that the proper amount of bonding material will be used when bonding the semiconductor element to the base. The isolating holes may be in the form of through holes or depressions.

BRIEF DESCRIPTION OF THE DRAWINGS

In the drawings, the same reference numerals indicate the same or corresponding parts.

DESCRIPTION OF THE PREFERRED EMBODIMENTS

Figure 1:
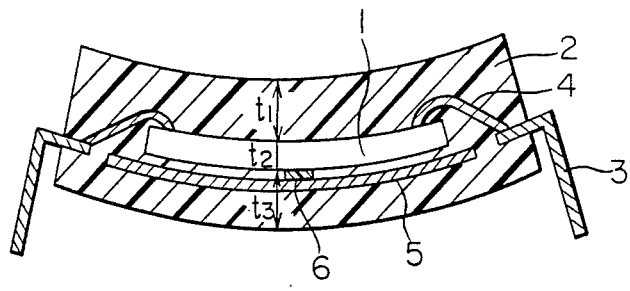
FIG. 1 is a vertical cross-sectional view of a conventional resin-encapsulated semiconductor device.
Figure 2A:
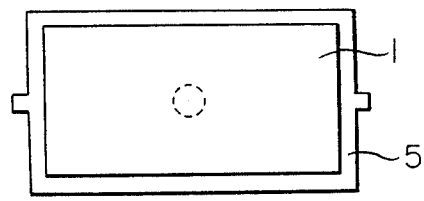
FIG. 2a is a plan view of the semiconductor element and base of the device of FIG. 1.
Figure 2B:
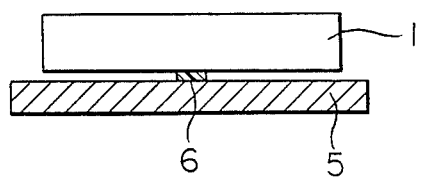
FIG. 2b is a vertical cross-sectional view of the same.
Figure 5:
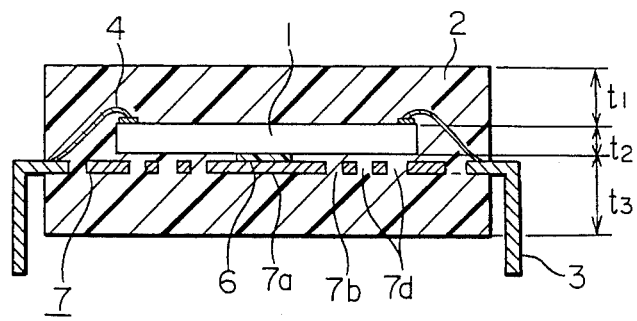
FIG. 5 is a vertical cross-sectional view of a first embodiment of a resin-encapsulated semiconductor device in accordance with the present invention.
Figure 6:
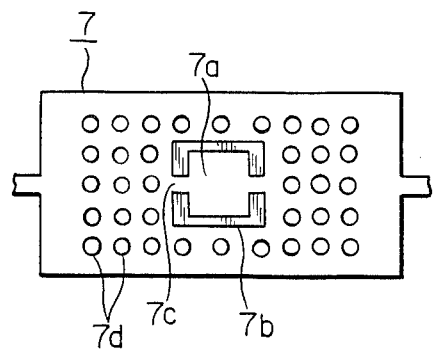
FIG. 6 is a plan view of the base of the embodiment of FIG. 5.

Hereinbelow, a number of preferred embodiments of a resin-encapsulated semiconductor device in accordance with the present invention will be described while referring to the accompanying drawings, FIGS. 5 and 6 of which illustrate a first embodiment. As shown in FIG. 5, which is a vertical cross-sectional view of this embodiment, a conventional semiconductor element 1 is bonded at the center of its bottom surface to the top surface of a flat base 7 by a conventional bonding material 6 such as a gold-silicon alloy. At the center of the base 7 is formed a bonding section 7a to which the semiconductor element 1 is bonded. The surface area of the bonding section 7a is smaller than the surface area of the bottom of the semiconductor element 1. As shown in FIG. 6, which is a plan view of the base 7, the bonding section 7a is separated from the remainder of the base 7 by isolating holes in the form of two elongated through holes 7b which substantially surround the bonding section 7a and isolate it from the remainder of the base 7 except for at two connecting portions 7c between the through holes 7b. The base 7 also has a plurality of through holes 7d formed in the portion thereof which is outside of the bonding section 7a. The semiconductor element 1 and the base 7 are encapsulated in a molded resin 2, which fills the insides of the holes 7b and 7d in the base 7. Like the conventional device of FIG. 1, this embodiment has a plurality of external leads 3 which extend to the outside of the resin 2 and internal leads 4 which electrically connect the external leads 3 to the terminal pads of the semiconductor element 1. The external leads 3 and the base 7 are made of a conventional copper alloy.

Figure 3:
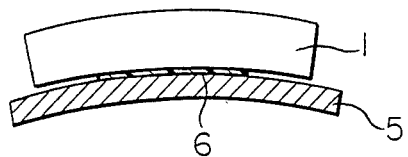
FIG. 3 is a vertical cross-sectional view of a conventional semiconductor device, illustrating bending prior to encapsulation.
Figure 4:
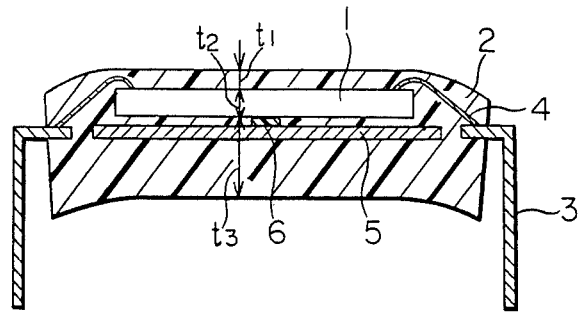
FIG. 4 is a vertical cross-sectional view of a conventional semiconductor device, illustrating bending subsequent to encapsulation.

The semiconductor element 1 is bonded to the bonding section 7a of the base 7 using conventional bonding techniques. Because of the separation between the bonding section 7a and the other portions of the base 7 which is provided by through holes 7b, the surface area in which bonding is performed is restricted to the surface area of the bonding section 7a. Therefore, by suitably choosing the size of the bonding section 7a, the surface area in which bonding takes place is limited to an appropriate size, and it is possible to prevent bending prior to encapsulation such as that illustrated in FIG. 3 which is due to the area of bonding being too large.

When the semiconductor element 1 and the base 7 are encapsulated in the resin 2, the resin 2 fills the insides of the holes 7d in the base 7 and clings to the inner surfaces thereof. Furthermore, the holes 7d increase the smoothness of the flow of the molten resin 2 so that the resin 2 will completely fill the gap between the semiconductor element 1 and the base 7. As a result, the adhesion of the resin 2 to the base 7 is increased, and the two are rigidly connected together. Therefore, since the coefficients of thermal expansion of the resin 2 and the copper alloy base 7 are similar, if t1 (the thickness of the resin 2 above the semiconductor element 1) is approximately equal to t3 (the thickness of the resin 2 below it), with the increased adhesion between the resin 2 and the base 7, the thermal expansion of each portion of the device will balance, thereby suppressing the bending of the device due to temperature variations subsequent to encapsulation, and bending damage can be prevented.

Figure 7:
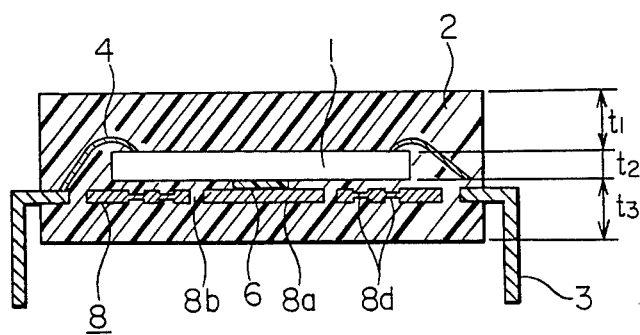
FIG. 7 is a vertical cross-sectional view of a second embodiment of the present invention.
Figure 8:
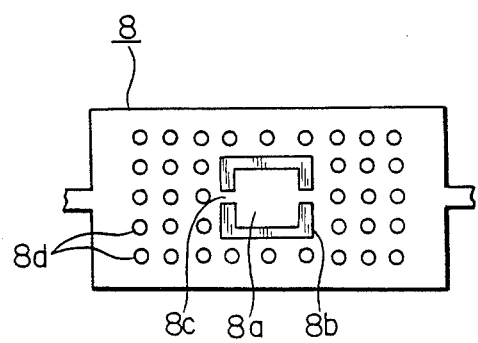
FIG. 8 is a plan view of the base of the embodiment of FIG. 7.

FIGS. 7 and 8 illustrate a second embodiment of the present invention, FIG. 7 being a vertical cross-sectional view thereof and FIG. 8 being a plan view of the base of the device of FIG. 7. This embodiment differs from the previous embodiment only in the structure of a base 8 thereof to which a semiconductor element 1 is bonded. Like the base 7 of FIG. 5, the base 8 is flat and has a bonding section 8a at its center which is substantially surrounded by a plurality of isolating holes in the form of elongated through holes 8b with the exception of two connecting portions 8c. In contrast to the base 7 of FIG. 5, the base 8 of FIG. 7 has a plurality of depressions 8d formed in its top and bottom surfaces on the outside of the bonding section 8a. These depressions 8d serve the same function as the through holes 7d of FIG. 5. Namely, when the device is encapsulated, the resin 2 fills the insides of the depressions 8d and clings to the inner surfaces thereof, thereby increasing the adhesion between the resin 2 and the base 8. Accordingly, if t1=t3, the device can be prevented from bending due to temperature variations subsequent to encapsulation; and bending damage can be effectively prevented. As in the previous embodiment, the bonding section 8a prevents bending of the semiconductor element 1 and the base 8 prior to encapsulation.

In both of the above-mentioned embodiments, the elongated isolating holes which substantially surround the bonding section are in the form of through holes 7b and 8b, but they can also be in the form of depressions formed in at least the top surface of the base and provide the same effects. It is also possible to omit the isolating holes without influencing the resistance of the device to bending after encapsulation.

Furthermore, in the above embodiments the base and the external leads 3 are made of a copper alloy, but other conventional materials, such as a 42% nickel-iron alloy, can also be employed with the same effects.

What is claimed is:

1. A packaged semiconductor device comprising:
a semiconductor element having opposed first and second sides;
a flat base having opposed top and bottom sides including a centrally disposed bonding portion on said top side defined by and substantially surrounded by a plurality of elongated recesses in said top side extending only partly through said base toward said bottom side for confining a bonding material to said bonding portion, said bonding portion having a smaller area than said second side and said top side;
a bonding material, disposed on said second side and on said top side confined to said centrally disposed bonding portion, bonding said semiconductor element to said base only at said centrally disposed portion; and
a resin encapsulating said semiconductor element and said base.

2. The packaged semiconductor device of claim 1 wherein said base includes a plurality of holes disposed outside said bonding portion extending through said base to said bottom side.

3. The packaged semiconductor device of claim 1 wherein said resin has substantially the same thickness opposite each of said first and second sides of said semiconductor element.

4. The packaged semiconductor device of claim 1 wherein said base includes a plurality of recesses in said top side extending only partly through said base toward said bottom side and disposed outside said bonding portion.

5. A packaged semiconductor device comprising:
a semiconductor element having opposed first and second sides;
a flat base having opposed top and bottom sides including a centrally disposed bonding portion on said top side defined by and substantially surrounded by a plurality of elongated holes in said top side extending through said base to said bottom side for confining a bonding material to said bonding portion, said bonding portion having a smaller area than said second side and said top side;

a bonding material, disposed on said second side and on said top side confined to said centrally disposed bonding portion, bonding said semiconductor element to said base only at said centrally disposed bonding portion; and a resin encapsulating said semiconductor element and said base.

6. The packaged semiconductor device of claim 5 wherein said base includes a plurality of recesses disposed outside said bonding portion extending only partly through said base toward said bottom side.

7. The packaged semiconductor device of claim 5 wherein said base includes a plurality of holes disposed outside said bonding portion extending through said base to said bottom side.

8. The packaged semiconductor device of claim 5 wherein said resin has substantially the same thickness opposite each of said first and second sides of said semiconductor element.

* * * * *